United States Patent [19]

Johnson

[11] 4,181,843
[45] Jan. 1, 1980

[54] VARIABLE RESISTANCE TYPE SENSOR CONTROLLED SWITCH

[76] Inventor: Lonnie G. Johnson, 1463 E. Barkley Dr., Mobile, Ala. 36606

[21] Appl. No.: 839,631

[22] Filed: Oct. 5, 1977

[51] Int. Cl.² ........................................... H01H 35/00
[52] U.S. Cl. .................................. 307/116; 307/117; 307/252 B; 340/598
[58] Field of Search ............... 307/116, 117, 118, 308, 307/310, 252 B, 252 N; 340/228 R, 598

[56] References Cited

U.S. PATENT DOCUMENTS

| | | | |
|---|---|---|---|
| 3,784,843 | 1/1974 | Gustus | 307/117 |
| 4,003,038 | 1/1977 | Meijer | 307/310 |

*Primary Examiner*—Gene Z. Rubinson
*Assistant Examiner*—Morris Ginsburg

[57] ABSTRACT

A circuit for controlling the flow of pulsating direct current by causing the on or off state of a gated switch to depend on the resistance of a sensor. The sensor used is of the variable resistance type whose impedance varies in a continuous manner with the phenomenon for which it was designed to detect. A variable resistor is used to select a magnitude of resistance of the sensor at which the switch is to turn on. A capacitor effects the return of the switch to an on state with each sequential direct current pulse until the resistance of the sensor changes in magnitude sufficient to negate the effect of the capacitor. An additional variable resistor is used to select a magnitude of charge to be collected by the capacitor and thus to control the amount of change in resistance of the sensor which must be realized before the switch is allowed to return to a sustained off state once an on state has been initiated.

8 Claims, 2 Drawing Figures

VARIABLE RESISTANCE TYPE SENSOR CONTROLLED SWITCH

SUMMARY

Variable resistance type sensors have been used in solid state circuits for some time to determine when to apply power to a load. However, some potential applications for these circuits have not been practical because of limitations in the range within which they operate, the sensitivity of their response, and/or a characteristic of applying a power level which varies as a continuous function of the condition said sensor detects.

The improvement offered by the present invention is the elimination of the use of contact switches to facilitate the latching of a silicon control rectifier into an on or off state in circuits designed to control the flow of sequential current pulses. This is accomplished by use of a circuit which latches into a full on state when the resistance of a variable resistance type sensor reaches a predetermined value. This predetermined value is selected by means of a variable resistor. The circuit drops into a full off state when the resistance of the sensor changes in the direction opposite of that which effected the on state by an amount determined by the resistance of a second variable resistor.

An object of the present invention is to apply power to a load under its control in a manner as would an on-off switch having no condition under which the power level being applied to the load varies as a continuous function of the resistance of said sensor using a minimum number of components.

A further object of the present invention is to use a variable resistance means for selecting a resistance of the sensor at which power would be applied to a load.

A still further object of the present invention is to eliminate rapid on-off cycling of said load caused by small fluctuations in the resistance of said sensor by means of a variable resistor for selecting a magnitude of change in resistance of the sensor which must be realized before power is to be removed from the load once it has been applied.

DESCRIPTION AND PREFERRED EMBODIMENT

A detailed description of the present invention is presented along with associated circuitry which facilitates its use as a temperature controller. However, it will become obvious, once the operation of the circuitry is understood, that it can be used to control the application of power to a load based on the response of almost any variable resistance type sensor. An understanding of the operation of the present invention can be derived from the following description by referencing the schematic diagram of FIG. 1 which shows the solid state circuit used for temperature control.

Figure 1:
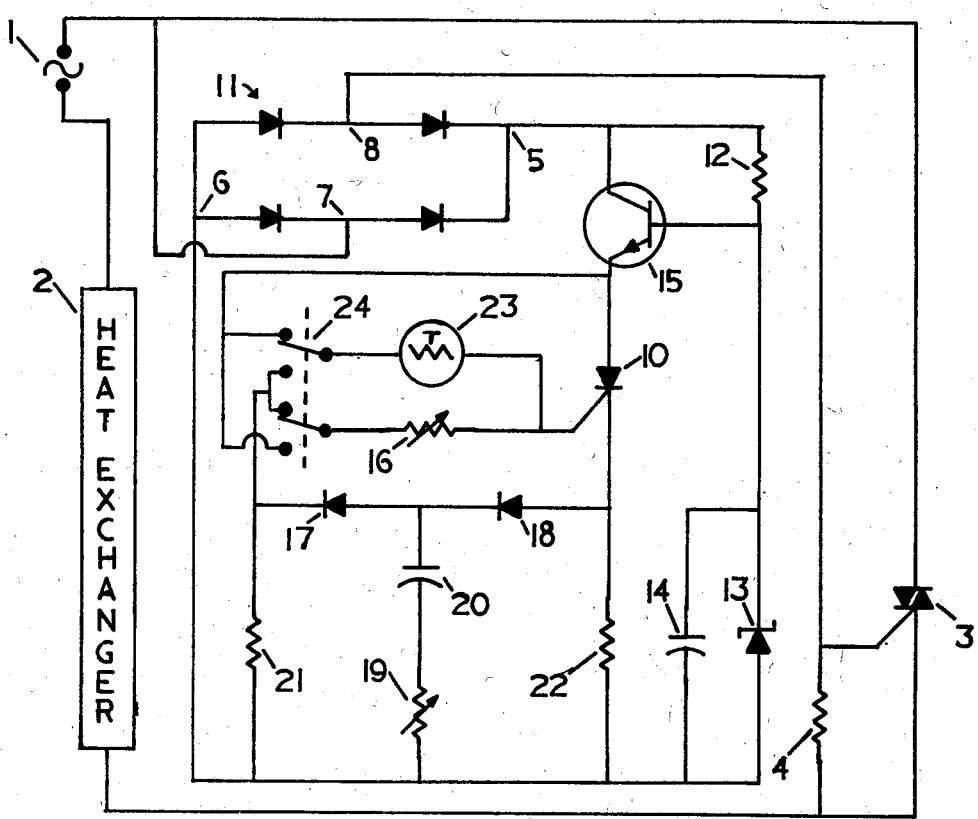
FIG. 1 is a schematic diagram depicting an application of the present invention as a thermostat to control the flow of alternating current to a heat exchanger.

Represented in FIG. 1 is alternating current source 1, heat exchanger 2, and a solid state circuit for controlling the application of the alternating current from source 1 to heat exchanger 2. The on and off state of heat exchanger 2 is determined by the on or off state of triac 3 which is electrically connected in series with heat exchanger 2 and alternating current source 1.

Triac 3 is normally off by means of resistor 4 which is electrically connected between its gate and first anode. The alternating current terminals, 7 and 8, of a full wave bridge rectifier 11, hence referred to as FWBR 11, are connected between the second anode and gate of triac 3 so that triac 3 can be switched on by increasing the flow of current across direct current terminals 5 and 6 of FWBR 11. The flow of direct current across terminals 5 and 6 is increased by turning on silicon control rectifier 10, hence referred to as SCR 10. Thus the on or off state of triac 3 depends on the on or off state of SCR 10. A direct current switching circuit means is formed by thermistor 23, variable resistor 16, resistors 19, 21 and 22, capacitor 20, diodes 17 and 18, and SCR 10.

Resistor 12, zener diode 13, capacitor 14, and transistor 15 form a voltage regulator means for supplying a regulated voltage relative to direct current terminal 6 of FWBR 11 to a voltage divider means formed by variable resistor 16, thermistor 23, and resistor 21. The voltage divider supplies control voltage to the gate of SCR 10 from the electrical interface of thermistor 23 and variable resistor 16. The regulated voltage is a means for isolating the response of SCR 10 from the constantly changing amplitude of the voltage being applied from alternating current source 1.

Variable resistor 16 is a means for selecting the temperature at which SCR 10 will be turned on. When the voltage at the junction of thermistor 23 and variable resistor 16 is of sufficient magnitude, it forward biases the gate-cathode junction of SCR 10 and results drop across resistor 22. The effected current flow through the gate-cathode junction of SCR 10 places SCR 10 in an on state. Thermistor 23 causes the magnitude of the voltage at the junction of thermistor 23 and variable resistor 16 to be temperature dependent.

Variable resistor 19 and capacitor 20 form a series pair having one end electrically connected between the two diodes, 17 and 18, and its opposite end electrically connected to direct current terminal 6 to which the regulated voltage source is relative. The described series pair is a means for controlling magnitude of the temperature change which must be sensed by thermistor 23 before SCR 10 is allowed to return to and remain in an off state once an on state has been initiated.

Capacitor 20 causes SCR 10 to return to an on state with each sequential direct current half wave by accumulating a charge by means of current flow from the cathode of SCR 10 through diode 18 during SCR 10's on state and discharging the accumulated charge through the voltage divider by means of diode 17 during SCR 10's next off state. By operating as described, diodes 17 and 18 is a second switch means for switching capacitor 20 between SCR 10 and the voltage divider with the on off switching of SCR 10.

Capacitor 20 and resistors 19, 21 and 22 are selected such that the voltage at the cathode of diode 17 and appearing as a drop across resistor 21 due to the discharge of capacitor 20 as the voltage supplied from AC power source 1 approaches zero does not have the magnitude needed to effect sufficient current flow by means of resistor 16 through the gate-cathode junction of SCR 10 and resistor 22 to initiate on states of SCR 10. However, with the resupply of regulated voltage from the emitter of transistor 15 with the next voltage half cycle originating from AC power source 1, the increased voltage appearing across resistor 21 as capacitor 20 continues to discharge has an additive effect of increasing the voltage at the gate of SCR 10 to return SCR 10 to an on state. The discharge of capacitor 20 through the voltage divider increases the gate voltage applied to SCR 10 thus turning it on with the beginning of the next direct current half wave from FWBR 11. Capacitor 20 continues to cause SCR 10 to return to an on state until thermistor 23 senses a temperature change, assumed to be due to the operation of heat exchanger 2, of sufficient magnitude to cause the resulting change in resistance of thermistor 23 to cancel the increase in SCR 10's gate voltage. Therefore, the magnitude of the increase in SCR 10's gate voltage determines the magnitude of the temperature change which must be sensed by thermistor 23 before SCR 10 is allowed to return to a sustained off state. As variable resistor 19 is in series with capacitor 20, it is a means for controlling the magnitude of the charge collected by capacitor 20 and thus the magnitude of the increase in SCR 10's gate voltage. By operating as described above, variable resistor 19 is a means for controlling the magnitude of the temperature change which must be sensed by thermistor 23 before heat exchanger 2 is allowed to return to an off state. For conditions under which diode 18 connected to the cathode of SCR 10 is reversed biased due to a charge collected on capacitor 20, gate current flowing from the cathode of SCR 10 is facilitated by a resistor 22.

The above described solid state circuit can be used to control the heating of a compartment in which the sensor is physically located. The sensor employed has a negative temperature coefficient. Therefore, in order to control the cooling of the compartment, the location of thermistor 23 and variable resistor 16 within the circuit must be interchanged. Switch 24 serves this purpose.

Some desired condition responsive device other than a thermistor can be used as sensor 23 to control the flow of power to a desired load wired-in in place of heat exchanger 2. The only constraint being that the device used as the sensor must vary in impedance with the condition it is designed to detect.

Figure 2:
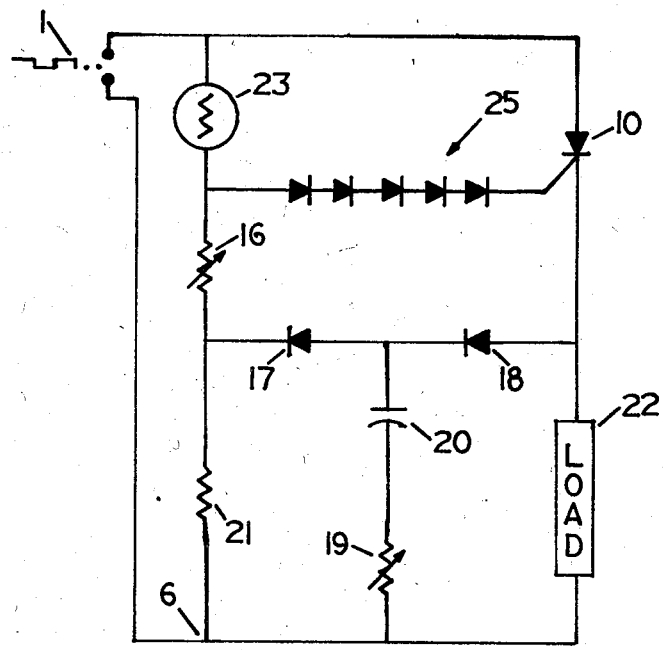
FIG. 2 is a schematic diagram of the present invention using a variable resistance type sensor to control the application of pulsating directing current to a load.

An appreciation for the wide range of applications for the present invention can be derived from the schematic diagram of FIG. 2. The circuit shown functions in the same manner as its corresponding portion of the circuit in FIG. 1. In this application, however, resistor 22 which was connected to the cathode of SCR 10 in the circuit in FIG. 1 has been replaced by load 22. By on off operation, as described for the circuit in FIG. 1, the circuit shown in FIG. 2 uses a variable resistance type sensor 23 to control the application of pulsating square wave direct current to load 22.

The value of resistor 22 of FIG. 1 was critically selected so that its impedance would be large enough to not allow sufficient current flow from the gate cathode junction of SCR 10 to initiate an on state yet small enough that once an on state has been initiated it would allow sufficient current flow, due to the effect of capacitor 20, to maintain the on state. Due to the fact that the impedance of loads may vary widely with applications of the present invention diode series 25 has been added to the pulse switching circuit means between the gate of SCR 10 and the electrical interface of sensor 23 and variable resistor 16 in FIG. 2. In this configuration the voltage at the sensor 23 variable resistor 16 interface, taken relative to common junction 6, at which SCR 10 is to turn on is determined by the number of diodes in diode series 25. An on state is initiated by means of current flow through diode series 25, the gate cathode junction of SCR 10 and load 22 when the voltage referred to in the previous sentence reaches a magnitude sufficient to forward bias the diodes in diode series 25 and the gate collector junction of SCR 10. By functioning in this manner diode series 25 is a third solid state switch means for turning SCR 10 on which dictated by the voltage divider. As previously discussed, once an on state has been initiated it is maintained by the back and forth switching of capacitor 20 between the voltage divider and the cathode of SCR 10 by diodes 17 and 18 until the effect of capacitor 20 is cancelled by a change in the resistance distribution through the voltage divider.

What is claimed is:

1. A condition responsive direct current (DC) half wave switching system for controlling the flow of DC half waves across the DC terminals of a rectifier means supplying alternating current (AC) control voltage to a solid state switch means for connection in series with an AC power source and a load for controlling the flow of operating power to the load, said DC half wave switching system comprising:
  a. a voltage regulator means for regulating the DC half waves supplied by said rectifier means,
  b. a silicon controlled rectifier (SCR) means for effecting an increased current flow across the DC terminals of the first mentioned rectifier means to provide an increased control voltage to said solid state switch means to render said solid state switch means conductive for allowing the flow of operating power to the load,
  c. a voltage divider means comprised of a sensor means, a variable resistance means and fixed resistance means, said voltage divider means supplying control voltage to said SCR means, said sensor means detecting the condition for initiating conductive states of said SCR means, said variable resistance means determining the condition for initiating on states of said SCR means,
  d. a capacitance means, a pair of diode means and a second variable resistance means, said pair of diode means switching said capacitance means between said SCR means and said voltage divider means with on-off switching of said silicon controlled rectifier means, said capacitance means accumulating a charge during on states of said SCR means and discharging through said voltage divider means to supply an increased control voltage to said SCR means to ensure continuous conductive states of said SCR means with each successive DC half wave, said second variable resistance means determining the magnitude of change in the impedance ratio of said voltage divider means required to return said SCR means to a sustained off state by determining the magnitude of charge which said capacitance means accumulates and discharges.

2. A condition responsive DC half wave switching system as described in claim 1 wherein said solid state switch means comprises a triac.

3. A condition responsive direct current (DC) half wave switching circuit for controlling the flow of operating power from a source of direct current pulses to a load, said direct current half wave switching circuit comprising:

a. a first switch means for controlling the flow of the direct current pulses, said first switch means being rendered conductive by supplying an increased control voltage to said first switch means, nonconductive states of said first switch means being initiated by an absence of current flow occurring between the DC voltage pulses, b. a voltage divider means coupled to said first switch means that includes, connected in series, a sensor means, a first variable resistance means and a fixed resistance means, said sensor means detecting the conditions for initiating on states of said first switch means, said variable resistance means determining the impedance of said sensor means at which said first switch means is to become conductive, said voltage divider means supplying control voltage to said first switch means with each direct current voltage pulse, c. a capacitance means for ensuring continuous conductive states of said first switch means with successive direct current pulses, said capacitance means accumulating a charge by means of current flow from said first switch means during each conductive state of said first switch means and discharging its accumulated charge through said voltage divider means to increase the control voltage supplied to said first switch means with the next successive direct current pulse to return said first switch means to a conductive state, d. a second switch means for switching said capacitance means between said first switch means and said voltage divider means with the on-off switching of said first switch means, e. a third switch means for switching control voltage to said first switch means from said voltage divider means to initiate on states of said first switch means, f. a second variable resistance means for selecting a magnitude of change in the impedance of said sensor means in a direction opposite to that initiating a sequence of on states of said first switch means which must be effected before said first switch means is allowed to return to a sustained off state by controlling the magnitude of charge which said capacitance means accumulates and discharges.

4. A DC half wave switching circuit as described in claim 3 wherein said first switch means comprises a silicon controlled rectifier.

5. A DC half wave switching circuit as described in claim 3 wherein said sensor means comprises a variable resistance type sensor having resistance which varies in a continuous manner with the condition said sensor means is designed to detect.

6. A DC half wave switching circuit as described in claim 3 wherein said second switch means comprises a pair of diodes, said capacitance means charging by means of one of said pair of diodes during each on state of said first switch means and discharging by means of the other diode of said pair of diodes through said voltage divider means during the next off state of said first switch means to return said first switch means to an on state with the next direct current pulse.

7. A DC half wave switching circuit as described in claim 3 wherein said second variable resistance means is in series with said capacitance means.

8. A DC half wave switching circuit as described in claim 3 wherein said third switch means comprises a set of diodes, said set of diodes electrically connected in series with each other and forming a path for control voltage from said voltage divider means to said first switch means when the control voltage reaches a magnitude sufficient to forward bias said set of diodes.

* * * * *